United States Patent
Zissing et al.

(10) Patent No.: US 10,615,025 B2
(45) Date of Patent: Apr. 7, 2020

(54) INFRARED RADIATING ELEMENT

(71) Applicant: Heraeus Noblelight GmbH, Hanau (DE)

(72) Inventors: Holger Zissing, Flieden (DE); Michael Honig, Rodenbach (DE); Lotta Gaab, Darmstadt (DE); Jürgen Weber, Kleinostheim (DE)

(73) Assignee: Heraeus Noblelight GmbH, Hanau (DE)

( * ) Notice: Subject to any disclaimer, the term of this patent is extended or adjusted under 35 U.S.C. 154(b) by 0 days.

(21) Appl. No.: 16/330,822

(22) PCT Filed: Aug. 15, 2017

(86) PCT No.: PCT/EP2017/070670
§ 371 (c)(1),
(2) Date: Mar. 6, 2019

(87) PCT Pub. No.: WO2018/054610
PCT Pub. Date: Mar. 29, 2018

(65) Prior Publication Data
US 2019/0206671 A1    Jul. 4, 2019

(30) Foreign Application Priority Data
Sep. 22, 2016 (DE) .......................... 10 2016 117 857

(51) Int. Cl.
*H01K 1/14* (2006.01)
*H01K 1/10* (2006.01)
(Continued)

(52) U.S. Cl.
CPC ................. *H01K 1/14* (2013.01); *H01K 1/10* (2013.01); *H01K 1/18* (2013.01); *H01K 1/20* (2013.01); *H01K 3/02* (2013.01); *H05B 3/0038* (2013.01)

(58) Field of Classification Search
CPC .. H01K 1/14; H01K 1/20; H01K 1/10; H01K 3/02; H05B 3/0038; G10H 2220/415;
(Continued)

(56) References Cited

U.S. PATENT DOCUMENTS 3,699,309 A    10/1972    Eck
5,731,594 A *    3/1998    Kuroda .................. G01J 3/108
                                                                 219/553

(Continued)

FOREIGN PATENT DOCUMENTS

AT    231023    1/1964
CN    1068696    2/1993
(Continued)

OTHER PUBLICATIONS

International Search Report and Written Opinion for corresponding PCT Application No. PCT/EP2017/070670 dated Feb. 20, 2018.
(Continued)

*Primary Examiner* — Joseph L Williams
*Assistant Examiner* — Jose M Diaz
(74) *Attorney, Agent, or Firm* — Stradley Ronon Stevens & Young, LLP

(57) ABSTRACT

An infrared emitter that comprises a cladding tube made of quartz glass that surrounds a heating filament as an infrared radiation-emitting element that is connected via current feedthroughs to an electrical connector outside the cladding tube. To improve the service life and power density, the heating filament comprises a carrier plate with a surface made of an electrically insulating material, whereby the surface is covered by a printed conductor made of a material that generates heat when current flows through it.

19 Claims, 2 Drawing Sheets

(51) Int. Cl.
  *H01K 3/02* (2006.01)
  *H05B 3/00* (2006.01)
  *H01K 1/18* (2006.01)
  *H01K 1/20* (2006.01)

(58) Field of Classification Search
  CPC ....... G02F 2203/11; H01L 2224/75283; H01L 2224/76283; H01L 2224/77283; H01L 2224/78283; H01L 2224/79283; H01L 2224/8023; H01L 2224/8423; H01L 2224/8523; H01L 2224/8123; H01L 2224/8223; H01L 2224/8323; H01L 2224/8623
  See application file for complete search history.

(56) References Cited

U.S. PATENT DOCUMENTS

| | | | |
|---|---|---|---|
| 5,965,051 A * | 10/1999 | Hirayama | C04B 35/58092 219/552 |
| 6,037,574 A | 3/2000 | Lanham et al. | |
| 6,169,275 B1 * | 1/2001 | Noda | H05B 3/141 219/542 |
| 6,591,062 B2 | 7/2003 | Scherzer et al. | |
| 2002/0096984 A1 | 7/2002 | Konishi et al. | |
| 2003/0031471 A1 | 2/2003 | Schneider et al. | |
| 2004/0175162 A1 | 9/2004 | Linow et al. | |
| 2009/0316268 A1 | 12/2009 | Werdecker et al. | |
| 2011/0248621 A1 | 10/2011 | Linow | |
| 2015/0132511 A1 | 5/2015 | Scheich et al. | |
| 2016/0116211 A1 | 4/2016 | Weber et al. | |
| 2018/0332665 A1 * | 11/2018 | Gaab | F27B 9/063 |
| 2019/0174580 A1 * | 6/2019 | Gaab | H05B 3/12 |

FOREIGN PATENT DOCUMENTS

| | | |
|---|---|---|
| DE | 9115714 | 2/1992 |
| DE | 10029437 | 1/2002 |
| DE | 102005058819 | 4/2007 |
| DE | 102006062166 | 6/2008 |
| DE | 102013105959 | 12/2014 |
| EP | 2963995 | 1/2016 |
| FR | 1400035 | 5/1965 |
| JP | H04129189 | 4/1992 |
| JP | 2003045622 | 2/2003 |
| KR | 20060025506 | 3/2006 |
| WO | 2015113885 | 8/2015 |

OTHER PUBLICATIONS

Manara et al. "Determining the Transmittance and Emittance of Transparent and Semitransparent Materials at Elevated Temperatures", 5th European Thermal-Sciences Conference, The Netherlands, 2008.

Office Action from corresponding German Patent Application No. 102016117857.8 dated Jul. 25, 2017.

Taiwanese Search Report from corresponding Taiwanese Patent Application No. 106127943 dated May 3, 2018.

* cited by examiner

INFRARED RADIATING ELEMENT

CROSS REFERENCE TO RELATED APPLICATIONS

This application is a U.S. National Phase filing of international Patent Application Number PCT/EP2017/070670 filed on Aug. 15, 2017, which claims priority of German Patent Application Number 102016117857.8 filed on Sep. 22, 2016. The disclosures of these two applications are hereby incorporated into this document by reference in their entirety.

TECHNICAL FIELD

The invention relates to an infrared emitter that comprises a cladding tube made of quartz glass that surrounds a heating filament as an infrared radiation-emitting element that is connected via current feedthroughs to an electrical connector outside the cladding tube.

Infrared emitters in the scope of the invention show two- or three-dimensional emission characteristics; they are used, for example, for polymerization of plastic materials or for curing of lacquers or for drying of paints on heating goods, but also for thermal treatment of semiconductor wafers in the semiconductor or photovoltaics industries.

BACKGROUND OF THE DISCLOSURE

Known infrared emitters comprise, inside the cladding tube made of glass, a coil-shaped resistor wire or a resistor tape as a heating conductor or heating filament. The wire or the tape has no or essentially no contact to the cladding tube. The heat transfer from the resistor wire to the cladding tube takes place essentially by thermal radiation. The heating conductor, also called a heating filament, is used as a current-conducting incandescent filament, glow wire or glow coil in incandescent lamps, in infrared emitters or in furnaces, and is usually present in an elongated form as a tape that is flat or twisted about its longitudinal axis or is coiled. Carbon fiber-based heating elements show good mechanical stability along with relatively high electrical resistance, and they allow for comparably rapid temperature changes.

In infrared emitters of this type, an electrical resistor element made of a resistor material is the actual infrared-emitting element of the emitter. The cladding tube made of quartz glass is essentially pervious to infrared radiation such that the radiation emitted by the resistor element is transferred to the heating goods without major loss of radiation.

Regarding the electrical properties, a special focus is on the electrical resistance of the heating filament. On the one hand, the electrical resistance should be constant over time even during exposure to load and, on the other hand, it should be as high as possible to be able to operate even short lengths of heating filament with common voltages (for example 230 V).

In the case of a tape-shaped heating filament, the nominal electrical resistance can be adjusted, as a matter of rule, by the cross-section and, in particular, by the thickness of the tape. However, the thickness of the tape can be reduced only to a limited extent considering the mechanical stability and a given minimum service life. This limitation is noticeable especially if the heating filament in-use is exposed to high mechanical loads such as if the irradiation lengths are 1 m or more.

An infrared emitter with a tape-shaped carbon heating filament is known, for example, from DE 100 29 437 A1. The coiled carbon tape is situated at a distance from the wall of the cladding tube and is arranged along the central axis thereof. Contacts with connecting lugs are provided on the ends of the carbon tape and are guided through a crimping area of the cladding tube to the external electrical connectors. The inside of the cladding tube is evacuated during installation in order to prevent changes to the resistance of the heating element due to oxidation. The power density of the carbon emitter is relatively high due to the large surface area of the coiled carbon tape as compared to infrared emitters comprising metallic heating elements. Accordingly, they are also suitable, in principle, for applications in which the emitter lengths are limited to less than one meter. However, it is a problem that the coiled tape causes the emission characteristics to not be fully homogeneous, but to comprise areas of higher power density (so-called hotspots) and of lower power density (cold spots). This problem must be taken into consideration during their use, in particular, for panel radiators by making the emission more homogeneous by keeping a larger distance from the heating goods. However, this measure is at the expense of the efficiency of the emitter.

Besides the infrared emitters with a carbon heating filament, emitters with so-called Kanthal® heating elements are known. They show a broadband infrared spectrum and are typically operated at temperatures of up to 1,000° C. The disadvantages in terms of the emission characteristics lacking homogeneity are similar to what has been described above for emitters with a carbon heating filament.

An infrared heater with a Kanthal coil is known, for example, from U.S. Pat. No. 3,699,309. The Kanthal coil is situated in a cladding tube made of glass and is supported on a cylindrical rod that has a semi-circular cross-section and is made of a ceramic fiber material ($Al_2O_3$—$SiO_2$). This kind of support is to prevent "hot spots" of the Kanthal coil. This support is disadvantageous in that the emission range of the infrared emitter is no longer 360° radially according to the circumference of the cladding tube, but rather is reduced by the area of the support rod that contacts the Kanthal coil.

SUMMARY OF THE INVENTION

The present invention is therefore based on the object to devise an infrared emitter that comprises high radiation power per unit area and, in particular, has a sheet resistance that is high enough such that it can also be operated by a common industrial electrical voltage of 230 V even with short irradiation lengths of 1 m and less, and that has a long service life.

The aforementioned object is met according to the invention based on an infrared emitter of the type specified above in that the heating filament comprises a carrier plate with a surface made of an electrically insulating material, whereby the surface is covered by a printed conductor made of a material that generates heat when current flows through it.

The present invention is based on the rationale to devise an infrared emitter in a cladding tube made of quartz glass, in which a carrier plate with a surface made of an electrically insulating material serves as the heating filament. In this context, the carrier plate may be formed from an electrically insulating material such that its entire surface is electrically insulating. Said carrier plate is induced to emit radiation in the infrared spectral range by a printed conductor that is applied to at least one side of the surface of the carrier plate and generates heat when current flows through it. The optical and thermal properties of the carrier plate result in an absorption in the infrared spectral range, which is the wavelength range between 780 nm and 1 mm. Accordingly, the part of the carrier plate that is heated by the printed conductor is the actual infrared radiation-emitting element.

Alternatively, just as well, only partial areas of the surface can be made electrically insulating, for example by an electrically insulating material that is applied to the carrier plate in the form of a surface layer. In this case, the printed conductor covers only the electrically insulating area of the surface or of the surface layer. The emission characteristics of the carrier plate, as the infrared radiation-emitting element, can be locally optimized by this configuration.

Since the printed conductor connected to the carrier plate is in direct contact with the surface thereof, a particularly compact infrared emitter is obtained. Due to the compact design of the infrared radiation-emitting element, it is possible to perform a targeted local irradiation of small surfaces at high radiation density.

In contrast to infrared emitters according to the prior art, in which an electrical resistor element made of a resistor material is the actual heating element of the emitter, the resistor element of the infrared emitters according to the invention is used, herein in the form of the printed conductor, to heat another component, which is referred to as the "substrate" or "carrier plate" hereinafter. The heat transport from the printed conductor to the carrier plate takes place, mainly, by thermal conduction; but it can also be based on convection and/or thermal radiation.

Due to being incorporated into a cladding tube, the infrared emitter according to the invention, when in use, is protected from influences from its surroundings, such as an oxidizing atmosphere. This results in a high radiation power combined with relatively homogeneous emission characteristics that are essentially independent of ambient influences. Moreover, the embodiment including a cladding tube makes the installation and, if applicable, the maintenance of the emitter easier.

It is to be understood that both the foregoing general description and the following detailed description of preferred embodiments are exemplary, but are not restrictive, of the disclosure.

BRIEF DESCRIPTION OF THE DRAWING

The disclosure is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

DETAILED DESCRIPTION OF PREFERRED EMBODIMENTS

Figure 1:
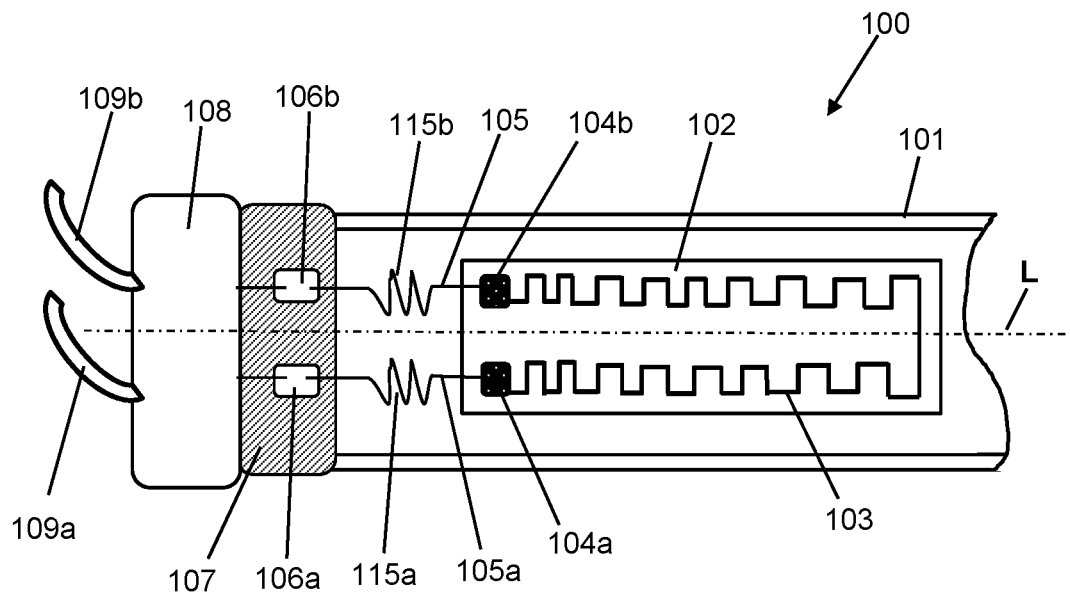
FIG. 1 shows a schematic partial view of the infrared emitter incorporated into a cladding tube made of quartz glass.

A preferred embodiment of the infrared emitter according to the invention consists of the material of the printed conductor covering the carrier plate being a non-precious metal.

The material of the printed conductor being a non-precious metal is characterized by a high specific electrical resistance on a small surface area, which leads to high temperatures being attained even at relatively low current flows. Unlike printed conductors possessing high fractions of precious metals, for example platinum, gold or silver, the printed conductor material made of non-precious metal is significantly less expensive without this being associated with compromises in its electrical properties.

The carrier plate with the heating conductor attached to it is incorporated into a cladding tube made of quartz glass, which prolongs the service life of the printed conductor since any corrosive attack, be it on a chemical and/or a mechanical basis, on the printed conductor by local ambient conditions is prevented. Printed conductors made of non-precious metals or non-precious metal alloys are particularly sensitive to this kind of corrosive attack.

The material of the printed conductor advantageously contains one or more elements from the group of tungsten (W), molybdenum (Mo), silicon carbide (SiC), molybdenum disilicide ($MoSi_2$), chromium silicide ($Cr_3Si$), polysilicon (Si), aluminum (Al), tantalum (Ta), copper (Cu), and high temperature-resistant steel. Printed conductor materials of this type have a specific sheet resistance in the range of 50 to approximately 100 Ohm/sq. Due to their respective electrical and thermal properties, materials from this group fulfill their function of thermal excitation of the carrier plate of the infrared emitter according to the invention and can, in addition, be produced inexpensively.

Moreover, it is time-proven for the carrier plate to be formed by at least two layers of material. In this context, the carrier plate can be formed by a basic material layer and a surface material layer, whereby the two material layers can differ in their electrical resistance or, if the electrical resistance is equal, can comprise different radiation emissivity. By this configuration, the optical and thermal properties of the carrier plate as the infrared radiation-emitting element—and therefore its emission characteristics—can be optimized for the individual application. Obviously, said advantageous embodiment is not limited to a two-layer system in a stack on top of one other. The material layers can just as well be arranged adjacent or next to each other.

Referring to the material of the carrier plate, it is time-proven for the material to comprise a composite material that is formed by a matrix component and by an additional component in the form of a semiconductor material.

The material of the carrier plate can be excited by thermal mechanisms and comprises a composite material that is formed by a matrix component and a semiconductor material as an additional component. The optical and thermal properties of the carrier plate result in absorption in the infrared spectral range. Conceivable matrix components include oxidic or nitridic materials, in which a semiconductor material is embedded as an additional component.

In this context, it is advantageous for the matrix component to be quartz glass and to preferably possess a chemical purity of at least 99.99% $SiO_2$ and a cristobalite content of at most 1%.

Quartz glass possesses the aforementioned advantages of good corrosion, temperature, and temperature cycling resistance and is always available at high purity. It is therefore a conceivable substrate or carrier plate material even in high-temperature heating processes with temperatures of up to 1,100° C. Cooling is not required.

The cristobalite content of the matrix being low, i.e. 1% or less, ensures that the devitrification tendency is low and, therefore, that the risk of crack formation during use is low.

As a result, even the strict requirements concerning the absence of particles, purity, and inertness that are often evident in semiconductor fabrication processes are met.

The heat absorption of the carrier plate material depends on the fraction of the additional component. The weight fraction of the additional component should therefore preferably be at least 0.1%. On the other hand, the volume fraction of the additional component being high can have an adverse effect on the chemical and mechanical properties of the matrix. Taking this into consideration, the weight fraction of the additional component is preferably in the range of 0.1% to 5%.

In a preferred embodiment of the infrared emitter, the additional component contains a semiconductor material in elemental form, preferably elemental silicon.

A semiconductor comprises a valence band and a conduction band that may be separated from each other by a forbidden band with a width of up to $\Delta E \approx 3$ eV. The conductivity of a semiconductor depends on how many electrons from the valence band cross the forbidden band to reach the conduction band. Basically, only a few electrons can cross the forbidden band and reach the conduction band at room temperature such that a semiconductor usually has only a low conductivity at room temperature. But the conductivity of a semiconductor depends essentially on its temperature. If the temperature of the semiconductor material rises, the probability that there is sufficient energy to elevate an electron from the valence band to the conduction band increases as well. Therefore, the conductivity of semiconductors increases with increasing temperature. Semiconductor materials show good electrical conductivity if the temperature is sufficiently high.

The fine-particle areas of the semiconductor phase in the matrix act as optical defects and can cause the material of the carrier plate to look black or grey-blackish by eye at room temperature, depending on the thickness. On the other hand, the defects also impact the overall heat absorption of the material of the carrier plate. This is mainly due to the properties of the fine-distributed phases of the semiconductor that is present in elemental form, to the effect that, on the one hand, the energy between valence band and conduction band (bandgap energy) decreases with the temperature and, on the other hand, electrons are elevated from the valence band to the conduction band if the activation energy is sufficiently high, which is associated with a clear increase in the absorption coefficient. The thermally activated population of the conduction band leads to the semiconductor material being transparent to a certain degree at room temperature for certain wavelengths (such as from 1,000 nm) and becoming opaque at high temperatures. Accordingly, the absorption and the emissivity can increase abruptly with increasing temperature of the carrier plate. This effect depends, inter alia, on the structure (amorphous/crystalline) and doping of the semiconductor. For example pure silicon shows a notable increase in emission from approximately 600° C., reaching saturation from approximately 1,000° C.

The spectral emissivity ε of the material of the carrier plate is at least 0.6 at a temperature of 600° C. for wavelengths between 2 μm and 8 μm.

According to Kirchhoff's law of thermal radiation, the absorptivity $\alpha_\lambda$ and the spectral emissivity $\varepsilon_\lambda$ of a real body in thermal equilibrium are equal.

$$\alpha_\lambda = \varepsilon_\lambda \qquad (1)$$

Accordingly, the semiconductor component leads to the emission of infrared radiation by the substrate material. The emissivity $\varepsilon_\lambda$ can be calculated as follows if the spectral hemispherical reflectance $R_{gh}$ and the transmittance $T_{gh}$ are known:

$$\varepsilon_\lambda = 1 - R_{gh} - T_{gh} \qquad (2)$$

In this context, the "emissivity" shall be understood to be the "spectral normal degree of emission." The same is determined using a measuring principle that is known by the name of "Black-Body Boundary Conditions" (BBC) and is published in "Determining The Transmittance And Emittance Of Transparent And Semitransparent Materials At Elevated Temperatures," J. Manara, M. Keller, D. Kraus, and M. Arduini-Schuster, 5th European Thermal-Sciences Conference, The Netherlands (2008).

The semiconductor material, and specifically the elemental silicon that is preferably used, therefore have the effect to make the vitreous matrix material black and to do so at room temperature, but also at elevated temperature above, for example, 600° C., which results in good emission characteristics in terms of a high broadband emission at high temperatures being attained. In this context, the semiconductor material, preferably the elemental silicon, forms its own Si phase that is dispersed in the matrix. This phase can contain multiple metalloids or metals (but metals only up to 50% by weight, better no more than 20% by weight; relative to the weight fraction of the additional component). In this context, the carrier plate material shows no open porosity, but, at most, closed porosity of less than 0.5% and has a specific density of at least 2.19 g/cm³. It is therefore well-suited for infrared emitters, with regard to which the purity or gas tightness of the carrier plate are important.

For use as infrared radiation-emitting material for an infrared emitter according to the present invention, the carrier plate material is covered by a printed conductor, which preferably is provided in the form of a burned-in thick film layer.

The thick film layer can be formed from resistor pastes by screen printing or from metal-containing ink by inkjet printing, and is subsequently burned-in at high temperature.

With regard to the temperature distribution being as homogeneous as possible, it has proven to be advantageous to provide the printed conductor as a line pattern covering a surface area of the carrier plate such that an intervening space of at least 1 mm, preferably at least 2 mm, remains between neighboring sections of the printed conductor.

The absorption capacity of the carrier plate material being high enables homogeneous emission even if the printed conductor occupation density of the heating surface is comparably low. A low occupation density is characterized in that the minimal distance between neighboring sections of the printed conductor is 1 mm or more, preferably 2 mm or more. The distance between sections of the printed conductor being large prevents flashover, which can occur, in particular, upon operation at high voltages in a vacuum. The printed conductor extends, for example, in a spiral-shaped or meandering line pattern.

In order to reduce a possible corrosive attack on the material of the printed conductor, it is preferred to keep the carrier plate including the printed conductor applied to it in the cladding tube in a vacuum or in a protective gas atmosphere that comprises one or more gases from the series of nitrogen, argon, xenon, krypton or deuterium.

The infrared emitter according to the invention is particularly well-suited for vacuum operation, but, in individual cases, it is sufficient to have a protective gas atmosphere surround the carrier plate in the quartz glass cladding tube to prevent oxidative changes to the printed conductor material.

In a preferred refinement of the infrared emitter according to the invention, multiple printed conductors, which each can be electrically triggered individually, are applied to a carrier plate.

The provision of multiple printed conductors makes feasible the individual triggering and adaptation of the irradiation intensity that can be attained with the infrared emitter. On the one hand, the radiation power of the carrier plate can be adjusted through suitable selection of the distances of neighboring sections of the printed conductor. In this context, sections of the carrier plate are heated to different degrees such that they emit infrared radiation at different irradiation intensities. Variation of the operating voltages and/or operating currents that are applied to the respective printed conductors allows for easy and rapid adjustment of the temperature distribution in the carrier plate.

Moreover, an advantageous refinement of the invention consists of multiple carrier plates with printed conductors being arranged in a cladding tube, whereby each of the carrier plates can be electrically triggered individually. This embodiment of the invention enables emitter variants that are adapted to the geometry of the heating goods. Accordingly, for example by arranging multiple carrier plates in a row in a single cladding tube, a panel radiator can be implemented that comprises different radiation intensity in individual sub-areas due to the individual triggering of the carrier plates.

It is also time-proven for the cladding tube to comprise, in sub-areas, a coating made of opaque, highly reflective, quartz glass. Specifically for formation of a slit-shaped radiator it is advantageous for the coating to be applied to the circumference of the cladding tube in a range of angles from 180° to 330°. A coating of this type reflects the infrared radiation of the heating filament and thus improves the efficiency of the infrared radiation with respect to the heating goods. The coating, also called the reflector layer, consists of opaque quartz glass and has a mean layer thickness of approximately 1.1 mm. It is characterized by the absence of cracks and a high density of approximately 2.15 g/cm$^3$ and is thermally stable at temperatures up to and above 1,100° C. The coating preferably covers a range of angles up to 330° of the circumference of the cladding tube and therefore leaves an elongated sub-area corresponding to the strip shape of the cladding tube unoccupied and transparent for the infrared radiation. This design renders the production of the so-called slit-shaped emitter easy.

Referring now to the drawing, in which like reference numbers refer to like elements throughout the various figures that comprise the drawing, FIG. 1 shows a first embodiment of an infrared emitter according to the invention, which, in total, has reference number 100 assigned to it, incorporated into a cladding tube 101 made of quartz glass. The cladding tube 101 has a longitudinal axis L. FIG. 1 shows a partial view of the infrared emitter 100 with a carrier plate 102, a printed conductor 103, and two contacting regions 104a, 104b for electrical contacting of the printed conductor 103.

The contacting regions 104a, 104b have thin wires 105a, 105b welded to them that lead to contact surfaces 106a, 106b in the crimping 107 in the connection base 108 of the cladding tube 101. The thin wires 105a, 105b comprise, on a longitudinal section of 5 mm, spring wire coils 115a, 115b to compensate for a thermal elongation of the thin wires 105a, 105b at high operating temperatures.

In the connection base 108, contact wires 109a, 109b are guided outwards and are also connected by welding to the contact surfaces 106a, 106b in the crimping 107.

There is a negative pressure (vacuum) established on the inside of the cladding tube 101 or an inert gas is used to produce a non-oxidizing atmosphere on the inside of the cladding tube 101 such that the printed conductors 103 made of non-precious metal are protected from oxidation.

The carrier plate 102 comprises a composite material having a matrix component in the form of quartz glass. A phase of elemental silicon is homogeneously distributed in said matrix component in the form of non-spherical areas. The matrix looks translucent to transparent to the eye. Upon microscopic inspection, it shows no open pores and at most closed pores with maximum mean dimensions of less than 10 µm. A phase of elemental silicon is homogeneously distributed in the matrix in the form of non-spherical areas. It accounts for a weight fraction of 5%. The maximum mean dimensions of the silicon phase areas (median) are in the range of approximately 1 µm to 10 µm. The composite material is gas-tight, it has a density of 2.19 g/cm$^3$ and it is stable in air up to a temperature of approximately 1,150° C. The embedded silicon phase contributes not only to the overall opacity of the composite material, but also has an impact on the optical and thermal properties of the composite material. Said composite material shows high absorption of heat radiation and high emissivity at high temperature. The carrier plate 102 is black in appearance and has a length (l) of 100 mm, a width (b) of 15 mm, and a thickness (t) of 2 mm.

The degree of emission measured on the composite material of the carrier plate 102 in the wavelength range of 2 µm to approximately 4 µm is a function of the temperature. The higher the temperature, the higher is the emission. At 600° C., the normal degree of emission in the wavelength range of 2 µm to 4 µm is above 0.6. At 1,000° C., the normal degree of emission in the entire wavelength range from 2 µm to 8 µm is above 0.75.

The printed conductor 103 is provided to be meander-shaped. The material for the printed conductor 103 essentially comprises non-precious metals such as tungsten and molybdenum and also polysilicon, whereby the printed conductor 103 of a suitable layout is applied to the carrier plate 102 by a screen-printable paste, and is then burnt in.

In an alternative embodiment of the infrared emitter 100 according to the invention, the carrier plate 102 comprises a material made of ceramics such as silicon nitride ($Si_3N_4$) or silicon carbide (SiC), both of which are dark grey to black in appearance. A carrier plate 102 with a base material layer made of SiC has a surface layer made of $SiO_2$, which is electrically insulating with respect to the metallic printed conductor 103, applied to its surface.

Glass ceramics that are dark brown or dark grey in appearance (for example NEXTREMA® glass available from Schott AG of Germany) are also well suited as a carrier plate material, as are carrier plates made of glassy carbon, such as plates made of the SIGRADUR® material (available from HTW Hochtemperatur-Werkstoffe GmbH of Germany).

Another alternative material for the carrier plate 102 is a polyimide plastic material that can be heated to a temperature of up to 400° C. Especially in applications in which a particularly quick power-on time (of a few seconds) is required, a carrier plate made of a polyimide film with a low thermal mass is expedient. Said polyimide film, as the carrier plate 102, also has printed conductors 103 made of non-precious metal applied to it. Because it is incorporated into a cladding tube 101 made of quartz glass, it can be operated in a non-oxidizing atmosphere.

Figure 2:
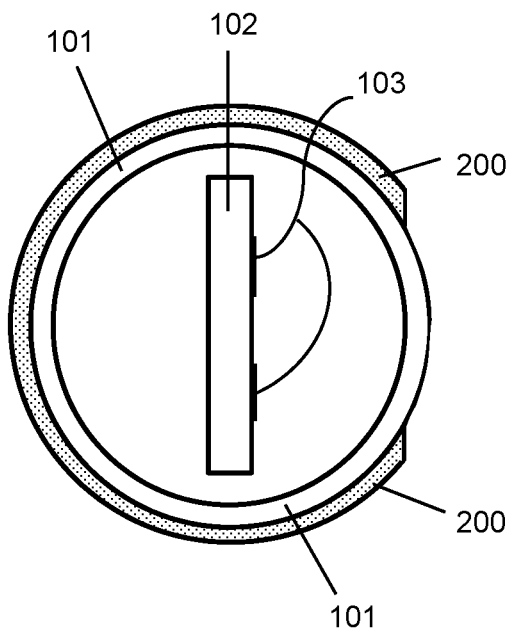
FIG. 2 shows a cross-section through a cladding tube with an infrared emitter according to the invention.

FIG. 2 shows a cross-section perpendicular to the longitudinal axis L of the cladding tube 101 with the infrared emitter 100 arranged inside it. A reflector layer 200 made of quartz glass is applied to the external circumferential surface of the cladding tube 101 over a length that corresponds to the length of the carrier plate 102, and covers 330° of the circumference. This configuration results in a so-called slit-shaped emitter with a narrow elongated open surface on the cladding tube 101 that allows the infrared radiation emitted by the carrier plate 102 to exit.

Figure 3:
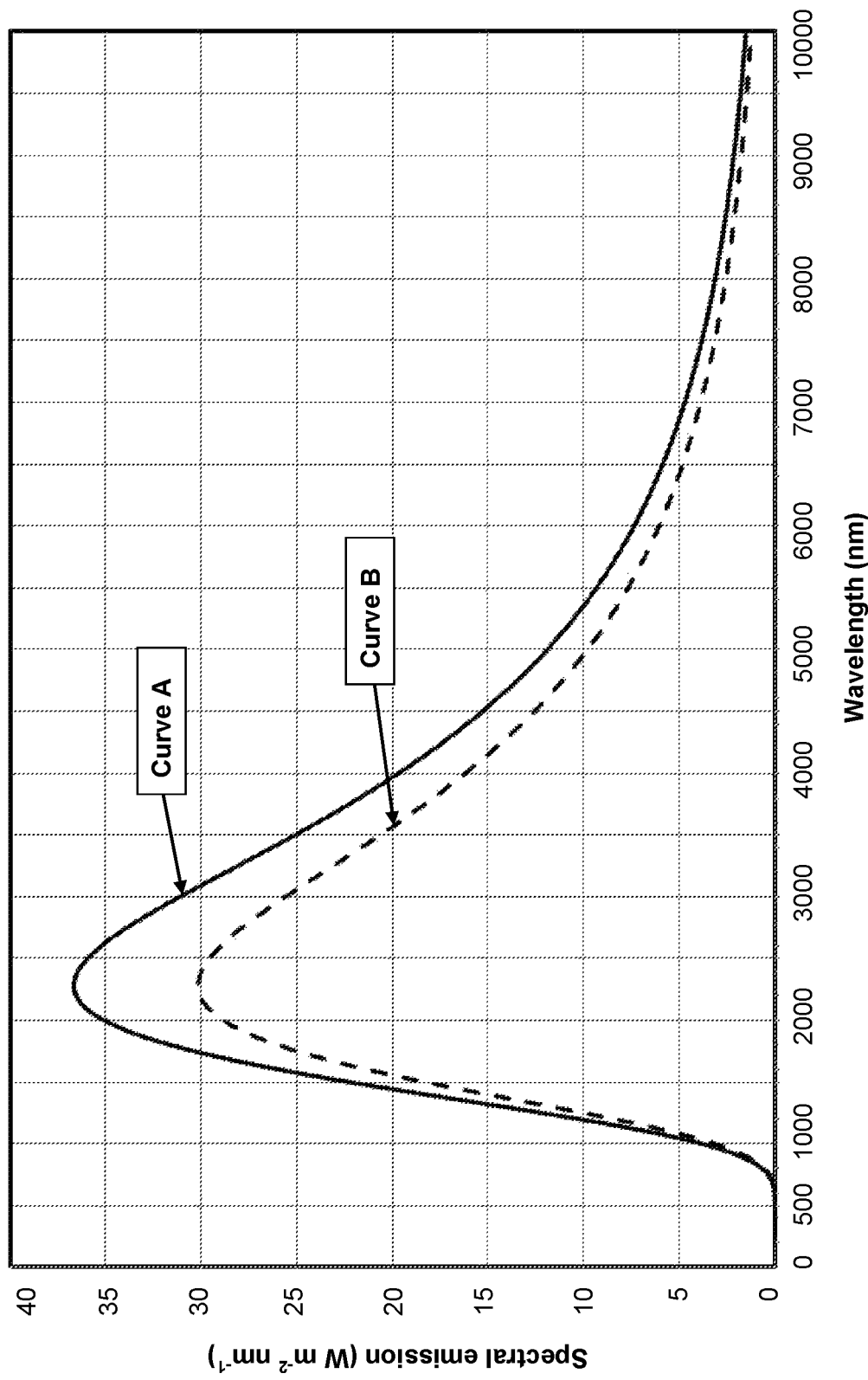
FIG. 3 shows a diagram of the emission characteristics of the infrared emitter according to the invention compared to a conventional emitter with Kanthal coil.

FIG. 3 shows the power spectrum of an infrared emitter 100 according to the invention (curve A) compared to an infrared emitter with a Kanthal coil (curve B). In this case, the carrier plate 102 of the infrared emitter 100 according to the invention is formed by a composite material made of a matrix component in the form of quartz glass and a phase of elemental silicon homogeneously distributed therein, of the type described in more detail above. The printed conductor material in this case is tungsten. The temperature of the printed conductor 103 of the carrier plate 102 of said IR emitter 100 is adjusted to 1,000° C. The reference emitter possessing a Kanthal coil is also operated at a temperature of approximately 1,000° C. It is evident that the infrared emitter 100 according to the invention has approximately 25% higher power in the wavelength range from 1,500 nm to approximately 5,000 nm in the peak of curve A than the reference emitter, represented by curve B.

Although illustrated and described above with reference to certain specific embodiments and examples, the present disclosure is nevertheless not intended to be limited to the details shown. Rather, various modifications may be made in the details within the scope and range of equivalents of the claims and without departing from the spirit of the disclosure. It is expressly intended, for example, that all ranges broadly recited in this document include within their scope all narrower ranges which fall within the broader ranges.

The invention claimed is:

1. An infrared emitter comprising:
a heating filament functioning as an infrared radiation-emitting element and including a carrier plate with a surface made of an electrically insulating material and a printed conductor covering the surface, the printed conductor being made of a material that generates heat when current flows through it and the carrier plate including a composite material that is formed by a matrix component and by an additional component in the form of a semiconductor material;
a cladding tube made of quartz glass that surrounds the heating filament; and
one or more current feedthroughs adapted to connect the heating filament to an electrical connector located outside the cladding tube.

2. The infrared emitter according to claim 1, wherein the material of the printed conductor is a non-precious metal.

3. The infrared emitter according to claim 1, wherein the material of the printed conductor contains one or more elements from the group of tungsten (W), molybdenum (Mo), silicon carbide (SiC), molybdenum disilicide ($MoSi_2$), chromium suicide ($Cr_3Si$), aluminum (Al), tantalum (Ta), polysilicon (Si), copper (Cu), and high temperature-resistant steel.

4. The infrared emitter according to claim 1, wherein the carrier plate is formed by at least two layers of material.

5. The infrared emitter according to, claim 1, wherein the matrix component is quartz glass and has a chemical purity of at least 99.99% $SiO_2$ and a cristobalite content of at most 1%.

6. The infrared emitter according to claim 1, wherein the additional component contains a semiconductor material in elemental form.

7. The infrared emitter according to claim 1, wherein the additional component is present in a type and an amount such as to effect, in the carrier plate at a temperature of 600° C., an emissivity $\Box$ of at least 0.6 for wavelengths between 2 and 8 µm.

8. The infrared emitter according to claim 1, wherein the carrier plate comprises a closed porosity of less than 0.5% and has a specific density of at least 2.19 g/cm³.

9. An infrared emitter comprising:
a heating filament functioning as an infrared radiation-emitting element and including a carrier plate with a surface made of an electrically insulating material and multiple printed conductors covering the surface, wherein each of the multiple printed conductors is made of a material that generates heat when current flows through it and wherein each of the multiple printed conductors can be electrically triggered individually;
a cladding tube made of quartz glass that surrounds the heating filament; and
one or more current feedthroughs adapted to connect the heating filament to an electrical connector located outside the cladding tube.

10. An infrared emitter comprising:
a heating filament functioning as an infrared radiation-emitting element and including multiple carrier plates each with a surface made of an electrically insulating material and a printed conductor covering the surface, the printed conductors being made of a material that generates heat when current flows through it,
a cladding tube made of quartz glass that surrounds the heating filament wherein the multiple carrier plates with printed conductors are arranged in the cladding tube, whereby each of the carrier plates can be electrically triggered individually; and
one or more current feedthroughs adapted to connect the heating filament to an electrical connector located outside the cladding tube.

11. The infrared emitter according to claim 1, wherein the cladding tube surrounds the heating filament with a vacuum or in a protective gas atmosphere that comprises one or more gases from the series of nitrogen, argon, xenon, krypton, or deuterium.

12. The infrared emitter according to claim 1, wherein the printed conductor has a burnt-in thick film layer.

13. The infrared emitter according to claim 1, further comprising a coating made of opaque highly reflective quartz glass and wherein the cladding tube has a circumference with partial areas of the circumference being covered by the coating.

14. The infrared emitter according to claim 13, wherein the coating covers the circumference of the cladding tube over a range of angles from 180° to 330°.

15. An infrared emitter comprising:
a heating filament functioning as an infrared radiation-emitting element and including a carrier plate with a surface made of an electrically insulating material and a printed conductor covering the surface, the printed conductor being made of a material that generates heat when current flows through it;
a cladding tube made of quartz glass that surrounds the heating filament;

one or more current feedthroughs adapted to connect the heating filament to an electrical connector located outside the cladding tube; and a coating made of opaque highly reflective quartz glass, wherein the cladding tube has a circumference with partial areas of the circumference being covered by the coating.

16. The infrared emitter according to claim 15 wherein the carrier plate is formed by at least two layers of material, comprises a composite material that is formed by a matrix component and by an additional component in the form of a semiconductor material, or comprises a closed porosity of less than 0.5% and has a specific density of at least 2.19 g/cm$^3$.

17. The infrared emitter according to claim 15, further comprising multiple printed conductors, which each can be electrically triggered individually, covering the surface of the carrier plate.

18. The infrared emitter according to claim 15, further comprising multiple carrier plates with printed conductors arranged in the cladding tube, whereby each of the carrier plates can be electrically triggered individually.

19. An infrared emitter comprising:
a heating filament functioning as an infrared radiation-emitting element and including a carrier plate with a surface made of an electrically insulating material and a printed conductor covering the surface, the printed conductor being made of a material that generates heat when current flows through it and the carrier plate having a closed porosity of less than 0.5% and a specific density of at least 2.19 g/cm$^3$;
a cladding tube made of quartz glass that surrounds the heating filament; and
one or more current feedthroughs adapted to connect the heating filament to an electrical connector located outside the cladding tube.

* * * * *